Jan. 4, 1966
JUNICHI YASUDA ETAL
3,227,955
FREQUENCY CONVERTER
Filed March 10, 1961
2 Sheets-Sheet 1
FIG. 1
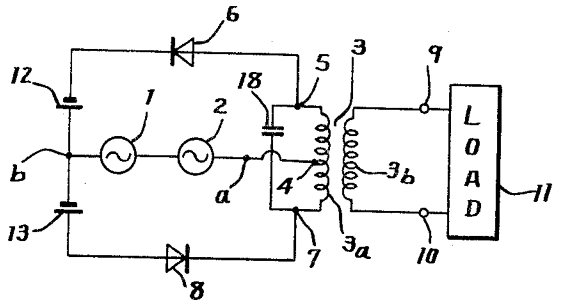
FIG. 2
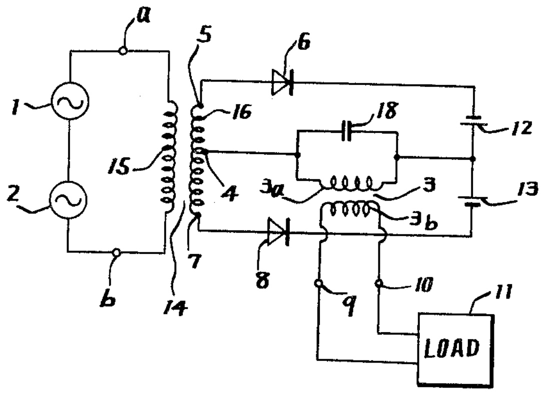
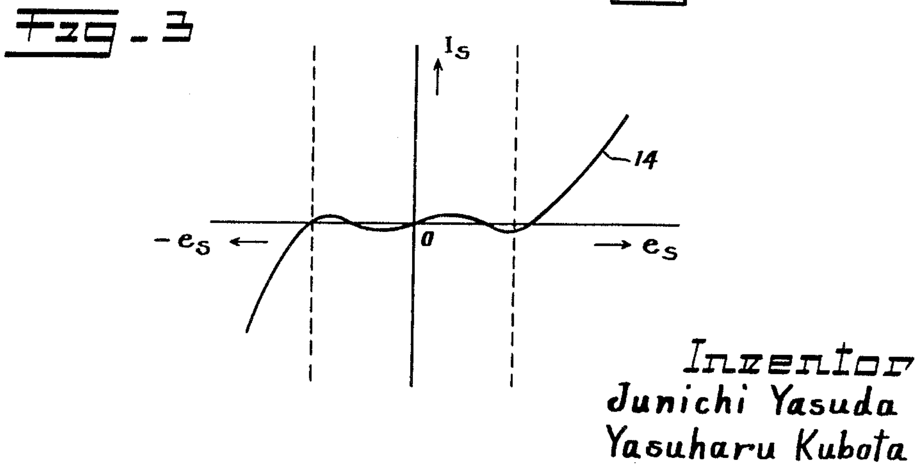
Inventor
Junichi Yasuda
Yasuharu Kubota
by Hill, Sherman, Meroni, Gross & Simpson Attnys.

Jan. 4, 1966 JUNICHI YASUDA ETAL 3,227,955

FREQUENCY CONVERTER

Filed March 10, 1961 2 Sheets-Sheet 2

Inventor
Junichi Yasuda
Yasuharu Kubota by Hill, Sherman, Meroni, Gross & Simpson Attys 3,227,955

FREQUENCY CONVERTER

Junichi Yasuda, Tokyo, and Yasuharu Kubota, Chiba-ken, Japan, assignors to Sony Corporation, Tokyo, Japan, a corporation of Japan Filed Mar. 10, 1961, Ser. No. 94,785
Claims priority, application Japan, Mar. 15, 1960, 35/8,643
11 Claims. (Cl. 325—449)

This invention relates to a frequency converter, and more particularly to an efficient frequency converter with highly improved frequency conversion gain using two tunnel diodes.

One object of this invention is to provide a frequency converter which is simple in construction and reliable in operation.

Another object of this invention is to provide a frequency converter of high gain and low noise.

A further object of this invention is to provide a simple and effective frequency converter which mixes an incoming signal with the output of an oscillator in a radio receiving set or the like to produce an intermediate frequency.

Other objects, features and advantages of this invention will become more fully apparent from the following description taken in connection with the accompanying drawings, in which:

FIGURE 1 is a circuit diagram illustrating a frequency converter, by way of example, embodying the teachings of this invention;

FIGURE 2 is a circuit diagram illustrating another example of a frequency converter embodying this invention;

FIGURE 3, FIGURE 4 and FIGURE 5 are curves illustrating the operation of the devices shown in FIGURE 1 and FIGURE 2.

Figure 4:
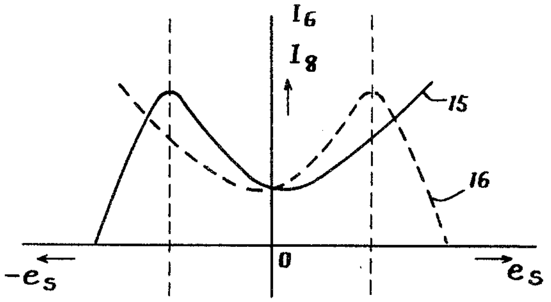

Arrangements have been provided in the past in radio receiving apparatus where a single tunnel diode is employed in a circuit which mixes an incoming high frequency signal and a local oscillation signal to obtain an intermediate frequency signal. In this arrangement, however, both input and output circuits are connected in series to a common tunnel diode. If the constants of such circuits are not strictly selected and if the bias point of the tunnel diode is not kept stable, parasitic oscillations are apt to occur which prevent stable operation of the device. Furthermore, in such arrangements of the past, the tunnel diode is generally operated in its positive conductance region, which means that the input resistance must be kept comparatively low. This, in turn, means that the conversion gain is small. Moreover, the noise level is relatively high.

In the present invention, the above mentioned defects are substantially eliminated, as will become more fully apparent from the following description made in connection with the illustrated examples of this invention.

The present invention comprises a circuit in which two tunnel diodes are connected in parallel to each other in such a manner that they are of the same polarity with respect to the output signal but are of reverse polarity with respect to the two input signals. More particularly, in the embodiment now to be described the two input signals are the high frequency signal and the oscillator signal while the output signal is an intermediate frequency signal, the whole arrangement being suitable for use in a radio receiver.

In the embodiment of the invention illustrated in FIGURE 1, a source 1 of high frequency signals is connected in series with an oscillator 2. One end *a* of this series circuit is connected to the mid-point 4 of the primary winding *3a* of an intermediate frequency transformer 3. The other end *b* of the series circuit is connected to the positive side of a direct current bias source 12 and also to the negative side of a second direct current bias source 13. A pair of tunnel diodes 6 and 8 are connected in parallel circuits across the series circuit including the high frequency signal 1 and the oscillator 2 with their polarities reversed. Specifically, tunnel diode 6 has its positive terminal connected at 5 to one end of the primary winding *3a* of the intermediate frequency transformer 3 while the negative side of the tunnel diode 6 is connected to the negative side of the bias source 12. The negative side of tunnel diode 8 is connected at 7 to the opposite end of the primary winding *3a* while the positive side of the tunnel diode 8 is connected to the positive side of the bias source 13. A load 11 is connected through terminals 9 and 10 to the secondary winding *3b* of the frequency transformer. A condenser 18 is connected across the primary winding *3a*, to tune it to the output frequency.

Figure 6:
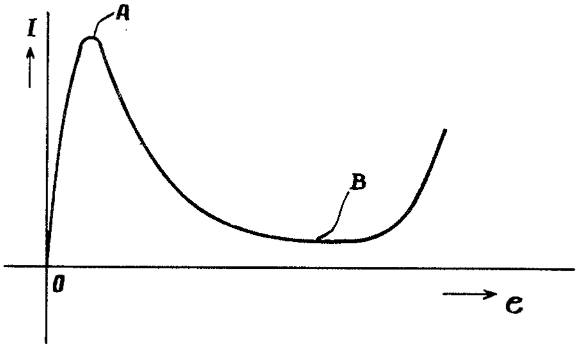
FIGURE 6 shows a characteristic voltage-current curve for a tunnel diode over a range of forwardly applied voltages.

The tunnel diodes 6 and 8 employed in this invention are semiconductor devices well known to those skilled in the art. For the purpose of understanding the present invention it is sufficient to state that a tunnel diode has a negative conductance characteristic over a range of forwardly applied voltages. This negative conductance characteristic is quite commonly referred to as a negative resistance characteristic. The characteristic voltage-current curve of such a tunnel diode over a range of forwardly applied voltages is given in FIGURE 6. The region on the curve of FIGURE 6 between points A and B is the negative resistance portion of the characteristic curve. Also, for the purpose of this invention, point B will be referred to as the minimum point of the curve and point A will be referred to as the maximum point of the curve.

In the illustrated embodiment of the present invention, as shown in FIGURE 1, the two tunnel diodes 6 and 8 are biased by their respective bias sources 12 and 13 to the minimum points of their respective negative resistance characteristic curves. That is, the bias is sufficient to place their respective operating points at the point B of their respective characteristic curves. The tunnel diodes 6 and 8 are chosen so that they have substantially identical negative characteristic curves and hence when no signal from either source 1 or source 2 appears across terminals *a* and *b*, no current will flow through this leg of the circuit, since currents flowing through tunnel diodes 6 and 8 cancel out in this middle leg of the circuit. Current flowing through the diodes 6 and 8 does, however, flow through the primary winding *3a* of the intermediate frequency transformer. Now if the voltage and current of an input signal between the terminals *a* and *b* are designated $e_s$ and $I_s$ a graph of the input voltage $e_s$ taken with respect to the current $I_s$ will have a relatively flat characteristic portion over a substantial range of voltages as shown by the curve 14 of FIGURE 3. The current $I_s$ of this curve is the current flowing through the central leg of the circuit or, in other words, through the high frequency source 1 and the oscillator 2.

In FIGURE 4 of the drawing the characteristic negative resistance curve of the tunnel diode 6 is shown by the curve 16, the $e_s$ being the forwardly applied voltage between points *a* and *b*. The curve 16 of FIGURE 4 is the characteristic negative resistance curve of the tunnel diode 8 but since we are interested in the range of forwardly applied voltages it will be observed that this curve has been inverted from end to end. Since tunnel diode 8 is reversely connected across points *a* and *b* with respect to the other tunnel diode 6 the indication in the diagram of $-e_s$ merely means that this is when the voltage is reversely applied to the terminals *a* and *b* when considered with respect to $e_s$.

Figure 5:
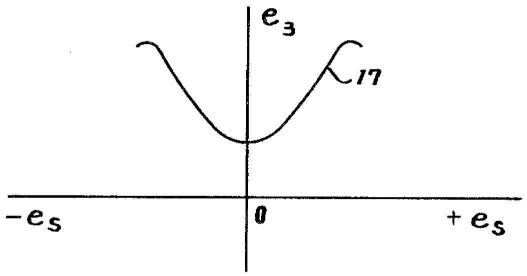

In this embodiment of the present invention, if the tunnel diodes 6 and 8 are so biased as to make the current substantially zero in the flat portion of the input current $I_s$ taken with respect to the input voltage $e_s$ as shown in curve 14 of FIGURE 3 and if they are operated at an input voltage below the voltage corresponding to the minimum point B of each of their respective characteristic curves 15 and 16, the resulting output voltage $e_3$ bears a relationship to the input voltage $e_s$ as shown by the curve 17 of FIGURE 5. This output voltage $e_3$ is the voltage appearing across the secondary coil 3*b* of the intermediate frequency transformer 3. It will be noted from FIGURE 5 that the curve is substantially symmetrical in the positive and negative regions. Accordingly, when a high frequency signal from the source 1 is superimposed on the output of the oscillator 2 and inserted betwen points *a* and *b* of the circuit of FIGURE 1, the resulting signal is detected in both tunnel diodes 6 and 8 and an intermediate frequency signal is produced which is the difference or sum of the two signal frequencies, and this intermediate frequency then appears at the output of the secondary coil 3*b* of the intermediate frequency transformer 3 and is then fed to the load 11.

As is apparent from an inspection of curve 14 of FIGURE 3, the input impedance may be taken to almost infinity over a range of input signals voltages and hence the frequency conversion gain may be greatly improved. Attention is further directed to the fact that tunnel diodes have very little noise in the range below the minimum point of their characteristic curves. For that reason, this use of the two diodes below the minimum points produce a frequency conversion device with an extremely good signal to noise ratio. In describing FIGURE 1 it has been pointed out that the two tunnel diodes 6 and 8 are biased preferably to a point in the vicinity of the minimum points of their respective characteristic curves. It has been found that results similar to those described above may be obtained from the same apparatus when the two tunnel diodes are biased to their respective maximum point A of their characteristic curves.

A different embodiment of the present invention is illustrated in FIGURE 2 of the drawings. A signal source 1 is serially connected with the output of an oscillator 2 between terminals *a* and *b*. The primary winding 15 of a transformer 14 is connected across the terminals *a* and *b*. The secondary winding 16 of the transformer 14 has its opposite ends 5 and 7 connected through the tunnel diodes 6 and 8 to direct current biasing sources 12 and 13 respectively. The positive side of the biasing sources 12 and 13 are connected together and also to one end of the primary winding 3*a* of the intermediate frequency transformer 3. The other side of the primary winding 3*a* is connected to the mid-point 4 of the secondary winding 16 of the transformer 14. A condenser 18 is connected across the primary winding 3*a* as it was in FIGURE 1. The intermediate frequency transformer 3 has a secondary winding 3*b* which has its opposite ends connected to terminals 9 and 10, the latter being for the purpose of having a load 11 connected thereto. By biasing the tunnel diodes 6 and 8 at either their minimum points of their negative resistance characteristic curves or their maximum points in the manner as described in connection with FIGURE 1, a symmetrical output voltage current is obtained from the intermediate frequency transformer 3 as shown in FIGURE 5. The reason for this is the same as explained in connection with FIGURE 1, it being noted that here, as in the previous embodiment, the two tunnel diodes are connected in parallel to each other in such a manner that they are of the same polarity with respect to the output signal but have reverse polarity with respect to the input signals.

It will be apparent from the above described embodiments of the present invention that a frequency converter of high gain and simple construction is achieved which is particularly suitable for use in a radio-television receiving apparatus and the like.

It will of course be apparent that many modifications and variations may be effected without departing from the scope of the novel concepts of this invention.

We claim as our invention:

1. A frequency converter comprising a pair of tunnel diode units and tapped impedance element serially connected with one another to form a loop, each of said tunnel diode units including a tunnel diode and a direct current bias source, an input circuit including two sources of alternating electric energy serially connected, a load circuit, one of said circuits being connected between the tap of said impedance element and a point between said tunnel diode units, the other of said circuits being electrically coupled to said impedance element, said diodes being biased to minimum points on respective voltage-current characteristic curves thereof, said diodes being connected in like polarity with respect to said load circuit and in reverse polarity with respect to said input circuit.

2. A frequency converter comprising a pair of tunnel diode units and a tapped impedance element serially connected with one another to form a loop, each of said tunnel diode units including a tunnel diode and a direct current bias source, an input circuit including two sources of alternating electric energy serially connected, one of said circuits being connected between the tap of said impedance element and a point between said tunnel diode units, the other of said circuits being electrically coupled to said impedance element, said diodes being biased to their maximum points on respective voltage-current characteristic curves thereof, said diodes being connected in like polarity with respect to said load circuit and in reverse polarity with respect to said input circuit.

3. A frequency converter comprising a pair of tunnel diode units and a tapped impedance element serially connected with one another to form a loop, each of said tunnel diode units including a tunnel diode and a direct current bias source, two input sources of alternating electric energy serially connected between the tap of said impedance element and a point between said tunnel diode units, and an output circuit electrically coupled to said impedance element, said diodes being biased to minimum points on respective voltage-current characteristic curves thereof, said diodes being connected in like polarity with respect to said output circuit and in reverse polarity with respect to said input circuit.

4. A frequency converter comprising a pair of tunnel diode units and a tapped impedance element serially connected with one another to form a loop, each of said tunnel diode units including a tunnel diode and a direct current bias source, two input sources of alternating electric energy serially connected between the tap of said impedance element and a point between said tunnel diode units, and an output circuit electrically coupled to said impedance element, said diodes being biased to maximum points on respective voltage-current characteristic curves thereof, said diodes being connected in like polarity with respect to said output circuit and in reverse polarity with respect to said two input sources.

5. A frequency converter comprising a pair of tunnel diode units and a tapped impedance element serially connected with one another to form a loop, each of said tunnel diode units including a tunnel diode and a direct current bias source, an input circuit including two sources of alternating electric energy serially connected, a load circuit, one of said circuits being connected between the tap of said impedance element and a point between said tunnel diode units, the other of said circuits being electrically coupled to said impedance element, said diodes being biased to the same one of two points on respective voltage-current characteristic curves thereof where such curves reverse directions, said diodes being connected in like polarity with respect to said load circuit and in reverse polarity with respect to said input circuit.

6. A frequency converter comprising a pair of tunnel diode units and a tapped impedance element serially connected with one another to form a loop, each of said tunnel diode units including a tunnel diode and a direct current bias source, two input sources of alternating electric energy serially connected between the tap of said impedance element and a point between said tunnel diode units, an output circuit electrically coupled to said impedance element, said diodes being biased to minimum points on respective voltage-current characteristic curves thereof, said diodes being connected in like polarity with respect to said output circuit and in reverse polarity with respect to said two input sources, and a condenser connected across said impedance element to tune the same to the frequency of said output circuit.

7. A frequency converter comprising a pair of tunnel diode units and a tapped impedance element serially connected with one another to form a loop, each of said tunnel diode units including a tunnel diode and a direct current bias source, two input sources of alternating electric energy serially connected between the tap of said impedance element and a point between said tunnel diode units, an output circuit electrically coupled to said impedance element, said diodes being biased to maximum points on respective voltage-current characteristic curves thereof, said diodes being connected in like polarity with respect to said output circuit and in reverse polarity with respect to said two input sources, and a condenser connected across said impedance element to tune the same to the frequency of said output circuit.

8. A frequency converter comprising a pair of tunnel diode units and a tapped impedance element serially connected with one another to form a loop, each of said tunnel diode units including a tunnel diode and a direct current bias source, a pair of input source of alternating electric energy electrically coupled to said impedance element, an output circuit connected between the tap of said impedance element and a point between said tunnel diode units, said diodes being biased to minimum points on respective voltage-current characteristic curves thereof, said diodes being connected in like polarity with respect to said output circuit and in reverse polarity with respect to said impedance element.

9. A frequency converter comprising a pair of tunnel diode units and a tapped impedance element serially connected with one another to form a loop, each of said tunnel diode units including a tunnel diode and a direct current bias source, a pair of input source of alternating electric energy electrically coupled to said impedance element, an output circuit connected between the tap of said impedance element and a point between said tunnel diode units, said diodes being biased to maximum points on respective voltage-current characteristic curves thereof, said diodes being connected in like polarity with respect to said output circuit and in reverse polarity with respect to said impedance element.

10. A frequency converter comprising a pair of tunnel diode units and a tapped impedance element serially connected with one another to form a loop, each of said tunnel diode units including a tunnel diode and a direct current bias source, a second impedance element electrically coupled to said tapped impedance element, a pair of input sources of alternating electric energy serially connected to said second impedance element, a third impedance element connected between the tap of said tapped impedance element and a point between said tunnel diode units, a load impedance electrically coupled to said third impedance element, said diodes being biased to minimum points on respective voltage-current characteristic curves thereof, said diodes being connected in like polarity with respect to said third impedance element and in reverse polarity with respect to said tapped impedance element, and a condenser connected across said third impedance element.

11. A frequency converter comprising a pair of tunnel diode units and a tapped impedance element serially connected with one another to form a loop, each of said tunnel diode units including a tunnel diode and a direct current bias source, a second impedance element electrically coupled to said tapped impedance element, a pair of input sources of alternating electric energy serially connected to said second impedance element, a third impedance element connected between the tap of said tapped impedance element and a point between said tunnel diode units, a load impedance electrically coupled to said third impedance element, said diodes being biased to minimum points on respective voltage-current characteristic curves thereof, said diodes being connected in like polarity with respect to said third impedance element and in reverse polarity with respect to said tapped impedance element, and a condenser connected across said third impedance element.

References Cited by the Examiner

UNITED STATES PATENTS

| | | | |
|---|---|---|---|
| 2,608,650 | 8/1952 | Myers | 325—430 |
| 2,773,979 | 12/1956 | Chatterton | 325—449 |
| 2,978,576 | 4/1961 | Watters | 250—20.33 |
| 2,978,579 | 4/1961 | Sosin | 325—442 |
| 3,119,072 | 1/1964 | Sommers | 329—166 |
| 3,148,331 | 9/1964 | Carlson | 325—449 |

FOREIGN PATENTS

| | | |
|---|---|---|
| 287,728 | 4/1953 | Switzerland. |

OTHER REFERENCES

"Transistorized Mixer Circuit," by Stephen S. Heller, RCA Technical Notes, January 1961 (2 pp.).

DAVID G. REDINBAUGH, *Primary Examiner.*

SAMUEL B. PRITCHARD, *Examiner.*